(12) United States Patent
Ganitzer et al.

(10) Patent No.: US 9,397,055 B2
(45) Date of Patent: Jul. 19, 2016

(54) PROCESSING OF THICK METAL PADS

(71) Applicant: Infineon Technologies AG, Neubiberg (DE)

(72) Inventors: Paul Ganitzer, Villach (AT); Rudolf Zelsacher, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 14/290,448

(22) Filed: May 29, 2014

(65) Prior Publication Data
US 2015/0348921 A1 Dec. 3, 2015

(51) Int. Cl.
*H01L 21/00* (2006.01)
*H01L 23/00* (2006.01)
*H01L 21/82* (2006.01)

(52) U.S. Cl.
CPC ............... *H01L 24/03* (2013.01); *H01L 21/82* (2013.01); *H01L 2924/0105* (2013.01); *H01L 2924/01028* (2013.01); *H01L 2924/01029* (2013.01); *H01L 2924/0132* (2013.01); *H01L 2924/01042* (2013.01); *H01L 2924/01046* (2013.01); *H01L 2924/01047* (2013.01); *H01L 2924/01078* (2013.01); *H01L 2924/01079* (2013.01)

(58) Field of Classification Search
CPC .................................. H01L 24/03; H01L 21/82
See application file for complete search history.

(56) References Cited

U.S. PATENT DOCUMENTS

| 5,539,325 | A | 7/1996 | Rostoker et al. |
|---|---|---|---|
| 6,972,202 | B2 | 12/2005 | Nishihashi et al. |
| 7,135,384 | B2 | 11/2006 | Takyu et al. |
| 7,923,351 | B2 | 4/2011 | Arita |
| 2001/0043076 | A1 | 11/2001 | Itasaka et al. |
| 2002/0013061 | A1 | 1/2002 | Siniaguine et al. |
| 2002/0030040 | A1 | 3/2002 | Farnworth |
| 2003/0160315 | A1 | 8/2003 | Kovar et al. |
| 2004/0232524 | A1 | 11/2004 | Howard et al. |
| 2005/0146013 | A1 | 7/2005 | Farnworth et al. |
| 2005/0287952 | A1 | 12/2005 | Ryan et al. |
| 2008/0213978 | A1 | 9/2008 | Henry et al. |
| 2011/0193200 | A1 | 8/2011 | Lyne et al. |
| 2011/0291287 | A1* | 12/2011 | Wu .................. H01L 21/76898 257/774 |

(Continued)

FOREIGN PATENT DOCUMENTS

CN 101044613 A 9/2007

OTHER PUBLICATIONS

Mariani, F., et al., "Current Challenges in Preassembly: The Focus Changes from Thinning to Singulation," KGD Packaging & Test Workshop, Napa, California, Sep. 9-12, 2007.

*Primary Examiner* — Richard Booth
(74) *Attorney, Agent, or Firm* — Slater Matsil, LLP

(57) ABSTRACT

In an embodiment of the present invention, a method of forming a semiconductor device includes providing a semiconductor substrate including a first chip region and a second chip region. A first contact pad is formed over the first chip region and a second contact pad is formed over the second chip region. The first and the second contact pads are at least as thick as the semiconductor substrate. The method further includes dicing through the semiconductor substrate between the first and the second contact pads. The dicing is performed from a side of the semiconductor substrate including the first contact pad and the second contact pad. A conductive liner is formed over the first and the second contact pads and sidewalls of the semiconductor substrate exposed by the dicing.

18 Claims, 11 Drawing Sheets

(56) References Cited

U.S. PATENT DOCUMENTS

2013/0084658 A1 4/2013 Vaupel et al.
2013/0084659 A1 4/2013 Martens et al.
2014/0070420 A1* 3/2014 Sapone ............... H01L 23/5227
257/773

* cited by examiner

US 9,397,055 B2

PROCESSING OF THICK METAL PADS

TECHNICAL FIELD

The present invention relates generally to semiconductor processing, and, in particular embodiments, to processing of thick metal pads.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically treated and the semiconductor devices are physically separated to form individual dies.

SUMMARY OF THE INVENTION

In an embodiment of the present invention, a method of forming a semiconductor device includes providing a semiconductor substrate comprising a first chip region and a second chip region. A first contact pad is formed over the first chip region and a second contact pad is formed over the second chip region. The first and the second contact pads are at least as thick as the semiconductor substrate. The method further includes dicing through the semiconductor substrate between the first and the second contact pads. The dicing is performed from a side of the semiconductor substrate comprising the first contact pad and the second contact pad. A conductive liner is formed over the first and the second contact pads and sidewalls of the semiconductor substrate exposed by the dicing.

In an alternative embodiment of the present invention, a method of forming a semiconductor device includes providing a semiconductor substrate comprising an active region at a first surface and forming a back side metallization layer over a second surface of the substrate. The second surface is opposite to the first surface. The back side metallization layer is at least as thick as the semiconductor substrate. The method further includes patterning the back side metallization layer. The back side metallization layer is removed from over dicing streets of the semiconductor substrate during the pattering. The method also includes dicing the semiconductor substrate from the second surface after the patterning and forming a conductive liner over the back side metallization layer and sidewalls of the semiconductor substrate exposed by the dicing.

In an alternative embodiment of the present invention, a method of forming a semiconductor device includes providing a semiconductor substrate comprising a first chip region and a second chip region, and forming a contact layer over the semiconductor substrate. A structured insulating layer is formed over the contact layer. A contact pad is formed within the structured insulating layer. After forming the contact pad, he semiconductor substrate is thinned. The contact pad is thicker than the semiconductor substrate after the thinning. The semiconductor substrate is diced after thinning the semiconductor substrate. A conductive liner is formed over the contact pad and sidewalls of the semiconductor substrate exposed by the dicing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

During the semiconductor assembly process, metallization is formed on the back side of the dies prior to attaching the dies to a die paddle or supporting platform. After back side metallization, dies are singulated from a common substrate using a chip separation processes such as mechanical dicing, dry laser dicing, water-jet guided laser dicing, stealth dicing, or plasma dicing. However, singulating thick metal pads in combination with thin silicon results in defects such as cracking, delamination, and other defects. Embodiments of the present invention enable singulation and assembly of dies with thick metallization without introducing these and other problems.

An embodiment of the present invention will be described using FIGS. 1-9. An alternative embodiment of the present invention will be described using FIGS. 10-12. Further alternative embodiments will be described using FIGS. 13-15 as well using FIG. 16.

Figure 1:
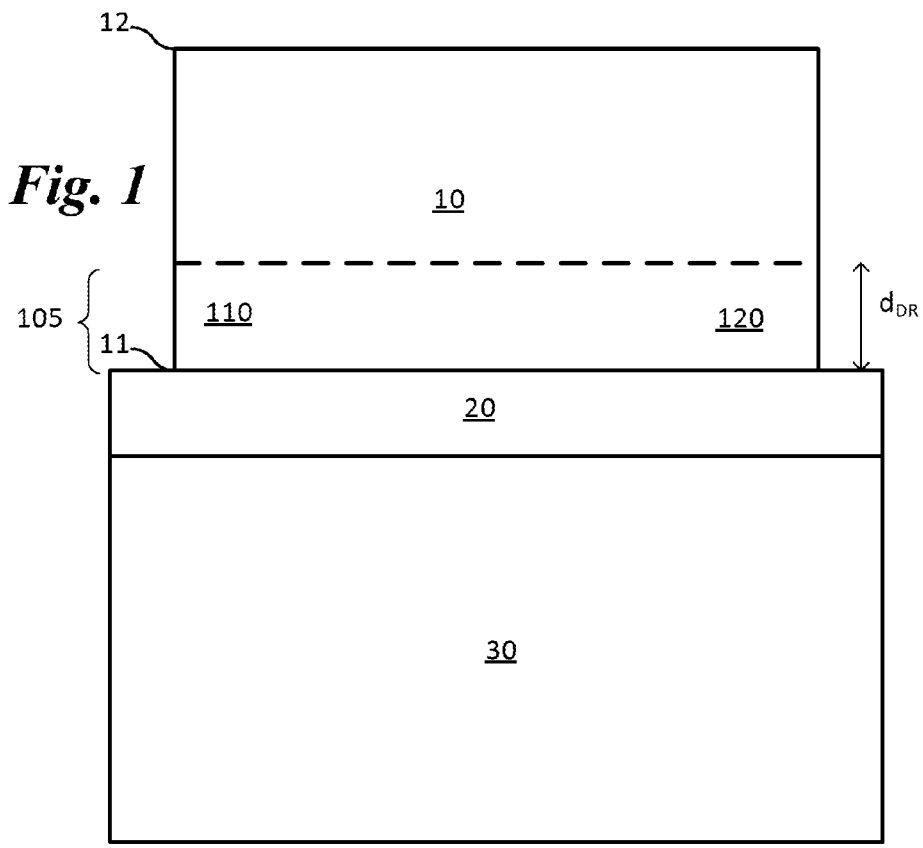
FIG. 1 illustrates a semiconductor device during fabrication in accordance with an embodiment of the present invention.

FIG. 1 illustrates a semiconductor device during fabrication in accordance with an embodiment of the present invention.

Referring to FIG. 1, a semiconductor substrate 10 after the completion of front end processing and back end processing is illustrated. The semiconductor substrate 10 has a plurality of semiconductor devices, e.g., a first chip 110, a second chip 120, formed within. Each of these chips may be any type of chip. For example, the chip may be a logic chip, a memory chip, an analog chip, and other types of chips. The chip may comprise a plurality of devices such as transistors or diodes forming an integrated circuit or may be a discrete device such as a single transistor or a single diode. In one embodiment, these are power chips and are vertical devices.

In one embodiment, the semiconductor substrate 10 may comprise a semiconductor wafer such as a silicon wafer. In other embodiments, the semiconductor substrate 10 may comprise other semiconductor materials including alloys such as SiGe, SiC or compound semiconductor materials such as GaAs, InP, InAs, GaN, sapphire, silicon on insulation, for example. The semiconductor substrate 10 may include epitaxial layers in one or more embodiments.

Referring to FIG. 1, device regions 105 including the first chip 110 and the second chip 120 are disposed within the semiconductor substrate 10. The device regions 105 may include doped regions in various embodiments. Further, some portion of the device regions 105 may be formed over the semiconductor substrate 10. The device regions 105 may include the active regions such as channel regions of transistors.

The semiconductor substrate 10 comprises a front side 11 and an opposite back side 12. In various embodiments, the active devices are formed closer to the front side 11 of the semiconductor substrate 10 than the back side 12. The active devices are formed in device regions 105 of the semiconductor substrate 10. Device regions 105 extends over a depth $d_{DR}$, which depending on the device, is about 5 µm to about 50 µm, and about 10 µm in one embodiment.

In various embodiments, all necessary interconnects, connections, pads etc. for coupling between devices and/or with external circuitry are formed over the front side 11 of the semiconductor substrate 10. Accordingly, a metallization layer is formed over the semiconductor substrate 10. The metallization layer may comprise one or more levels of metallization. Each level of metallization may comprise metal lines or vias embedded within an insulating layer. The metallization layer may comprise metal lines and vias to contact the device regions and also to couple different devices within the chips.

A protective layer, such as a passivation layer, may be formed over the metallization layer before further processing. The protective layer may comprise an oxide, nitride, polyimide, or other suitable materials known to one skilled in the art. The protective layer may comprise a hard mask in one embodiment, and a resist mask in another embodiment. The protective layer helps to protect the metallization layer as well as the device regions during subsequent processing.

After forming the protective layer, the front side 11 of the semiconductor substrate 10 is attached to a carrier 30 using an adhesive component 20. Further, in some embodiments, a primer coating may be applied prior to coating the adhesive component 20. The primer coating is tuned to react with the surface of the semiconductor substrate 10 and convert potentially high surface energy surfaces to lower surface energy surfaces by forming a primer layer. Thus, in this embodiment, the adhesive component 20 interacts only with the primer layer improving the bonding.

In one or more embodiments, the adhesive component 20 may comprise a substrate, e.g., polyvinyl chloride, with the coating of an adhesive layer such as an acrylic resin.

The adhesive component 20 may comprise an organic compound such an epoxy based compound in alternative embodiments. In various embodiments, the adhesive component 20 comprises an acrylic based, not photoactive, organic glue. In one embodiment, the adhesive component 20 comprises acrylamide. In another embodiment, the adhesive component 20 comprises SU-8, which is a negative tone epoxy based photo resist.

In alternative embodiments, the adhesive component 20 may comprise a molding compound. In one embodiment, the adhesive component 20 comprises an imide and/or components such a poly-methyl-methacrylate (PMMA) used in forming a poly-imide.

In another embodiment, the adhesive component 20 comprises components for forming an epoxy-based resin or co-polymer and may include components for a solid-phase epoxy resin and a liquid-phase epoxy resin. Embodiments of the invention also include combinations of different type of adhesive components and non-adhesive components such as combinations of acrylic base organic glue, SU-8, imide, epoxy-based resins etc.

In various embodiments, the adhesive component 20 comprises less than about 1% inorganic material, and about 0.1% to about 1% inorganic material in one embodiment. The absence of inorganic content improves the removal of the adhesive component 20 without leaving residues after plasma etching.

In one or more embodiments, the adhesive component 20 may comprise thermosetting resins, which may be cured by annealing at an elevated temperature. Alternatively, in some embodiments, a low temperature annealing or bake may be performed to cure the adhesive component 20 so that adhesive bonding between the carrier 30 and the adhesive component 20 and between the adhesive component 20 and the semiconductor substrate 10 is formed. Some embodiments may not require any additional heating and may be cured at room temperature or using UV cure.

After mounting the semiconductor substrate 10 over the carrier 30 using the adhesive component 20, the semiconductor substrate 10 is subjected to a thinning process. The final depth of the chip formed in the semiconductor substrate 10 will be determined after thinning. The bottom surface of the first chip 110 and the second chip 120 will be exposed after a thinning process. A thinning tool, which may be a grinding tool in one embodiment, reduces the thickness of the semiconductor substrate 10. In another embodiment, the thinning tool may use a chemical process such as wet etching or plasma etching to thin the semiconductor substrate 10.

Figure 2:
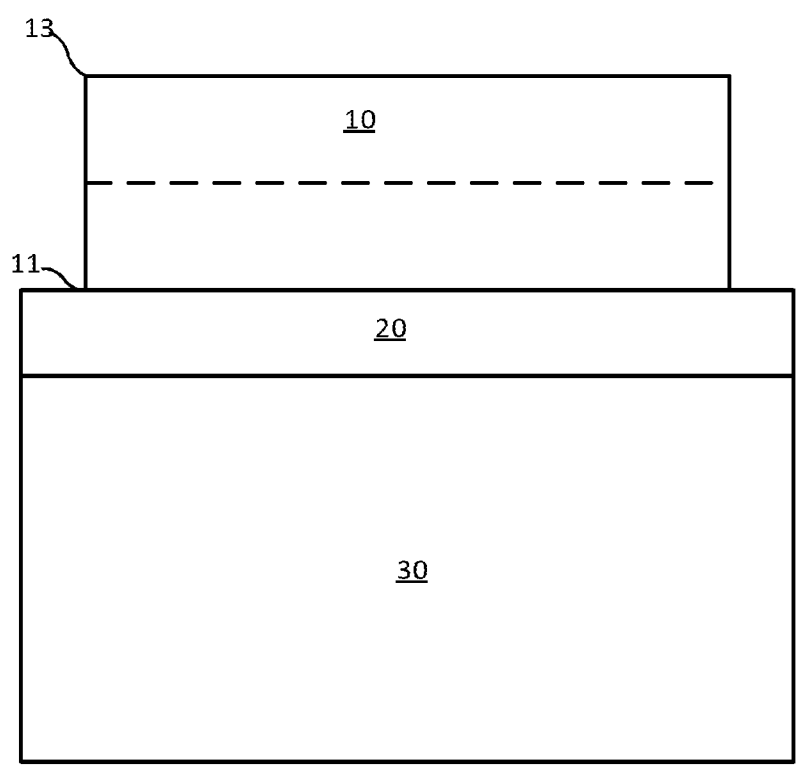
FIG. 2 illustrates a semiconductor device during fabrication after thinning the substrate mounted over a carrier in accordance with embodiments of the present invention.

FIG. 2 illustrates a semiconductor device during fabrication after thinning the substrate mounted over a carrier in accordance with embodiments of the present invention.

The thinning process exposes a new back side 13 of the semiconductor substrate 10 as illustrated in FIG. 2.

Figure 3:
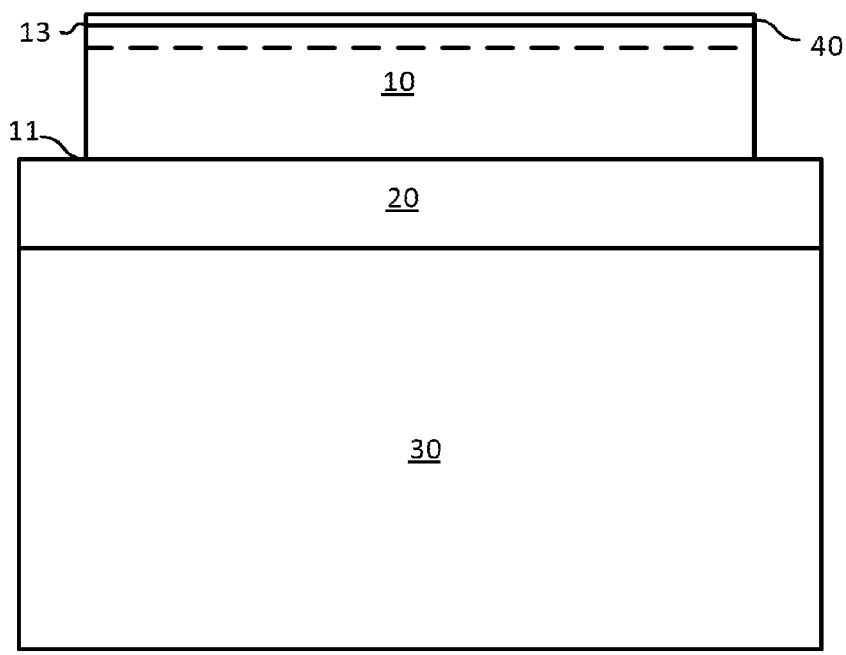
FIG. 3 illustrates a semiconductor device during fabrication after forming a contact layer over a back side of the substrate in accordance with embodiments of the present invention.

FIG. 3 illustrates a semiconductor device during fabrication after forming a contact layer over a back side of the substrate in accordance with embodiments of the present invention.

As next illustrated in FIG. 3, a contact layer 40 is deposited over the back side 13 of the substrate 10. The contact layer 40 may comprise more than one conductive layer in various embodiments. For example, the contact layer 40 may comprise a contact metal layer contacting the semiconductor substrate 10, a barrier metal layer over the contact metal layer, and an upper seed layer over the contact metal layer. The seed layer may be used to form a seed for the subsequent electroplating process, for example.

In various embodiments, the contact metal layer of the contact layer 40 contacts a doped layer of the semiconductor substrate 10 thereby forming a low resistance ohmic contact. In one embodiment, contact metal layer of the contact layer 40 may be formed as a silicide by depositing a silicide source metal such as nickel, tungsten, cobalt, titanium, tantalum, and others over the back side 13 of the substrate 10. The substrate 10 may be heated so as to form a silicide layer after which excess silicide source metal may be removed. In some embodiments, the silicide formation may be performed at a different process step due to the limited temperature allowed by the carrier/glue system.

In one embodiment, the contact layer 40 comprises a stack of titanium/titanium nitride/copper so that the titanium forms a contact metal layer, the titanium nitride forms a barrier layer, and the copper layer forms a seed layer.

In various embodiments, the barrier metal layer may be a diffusion barrier metal such as titanium nitride, titanium, tantalum, tantalum nitride, tungsten nitride, tungsten carbo nitride (WCN), ruthenium or other suitable conductive nitrides or oxides.

Figure 4:
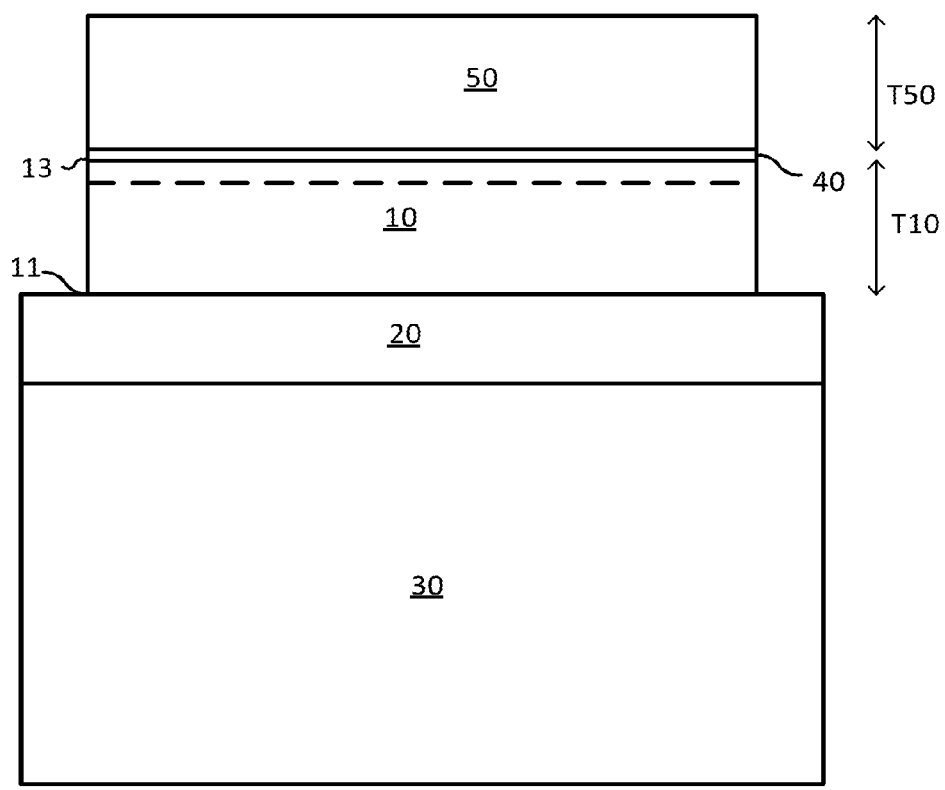
FIG. 4 illustrates a semiconductor device during fabrication after depositing a back side metallization layer in accordance with embodiments of the present invention.

FIG. 4 illustrates a semiconductor device during fabrication after depositing a back side metallization layer in accordance with embodiments of the present invention.

A back side metallization layer 50 is formed on the exposed back surface and sidewalls of the substrate 10 (e.g., first chip 110 and second chip 120). In various embodiments, the back side metallization layer 50 is a thick layer and comparable to the thickness of the devices regions 105 in the substrate 10. In one or more embodiments, the back side metallization layer 50 is at least 5 µm, and at least 20 µm in another embodiment.

In various embodiments, the back side metallization layer 50 may comprise more than one metal layer. In one or more embodiments, the back side metallization layer 50 may be deposited using a physical vapor deposition process. In alternative embodiments, the back side metallization layer 50 may be deposited using other vapor deposition processes including chemical vapor deposition, atomic layer deposition, electrochemical deposition, electroless deposition, and others.

In one or more embodiments, the back side metallization layer 50 comprises aluminum. In an alternative embodiment, the back side metallization layer 50 comprises copper.

Figure 5:
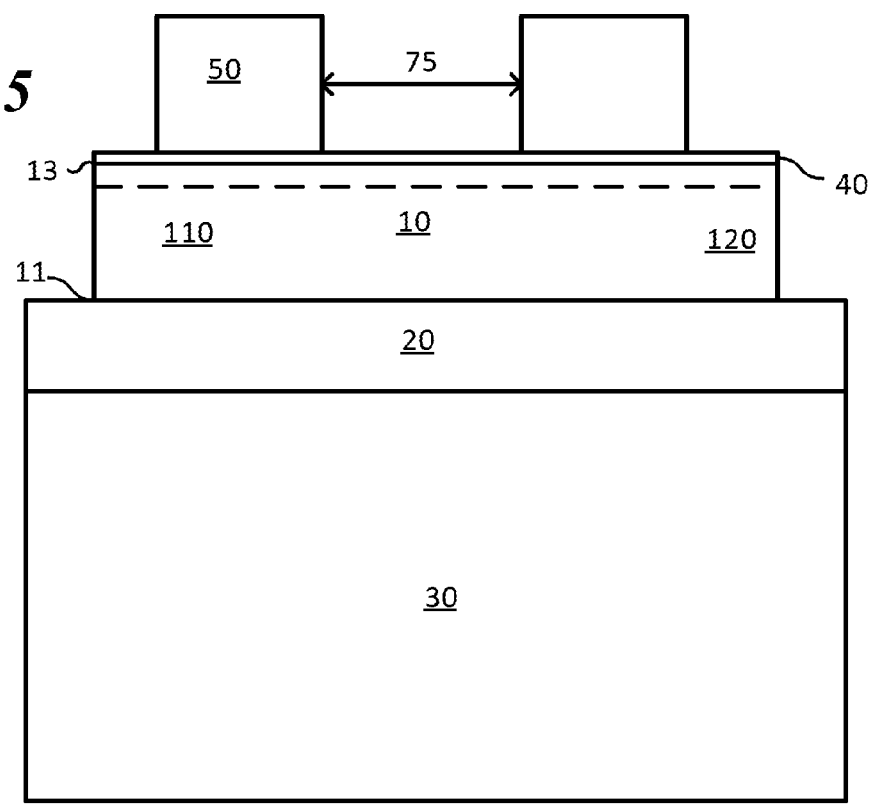
FIG. 5 illustrates a semiconductor device during fabrication after structuring the back side metallization layer in accordance with embodiments of the present invention.

FIG. 5 illustrates a semiconductor device during fabrication after structuring the back side metallization layer in accordance with embodiments of the present invention.

In one or more embodiments, the back side metallization layer 50 is patterned to form mesas. As illustrated in FIG. 5, the back side metallization layer 50 may be patterned using a conventional lithography process in one embodiment. For example, a photo resist material may be deposited over the back side metallization layer 50. The photo resist material is exposed through a mask and developed, which forms the patterned photo resist. Using the patterned photo resist as an etch mask, the underlying back side metallization layer 50 may be etched. In various embodiments, the back side metallization layer 50 may be etched using an anisotropic etching process. In one or more embodiments, the back side metallization layer 50 is etched using a reactive ion etching process. Such a substractive process may be used for depositing aluminum or copper based back side metallization layer 50, for example.

In various embodiments, the back side metallization layer 50 is removed from over the dicing streets 75 or kerf regions between the chips within the substrate 10.

Figure 6:
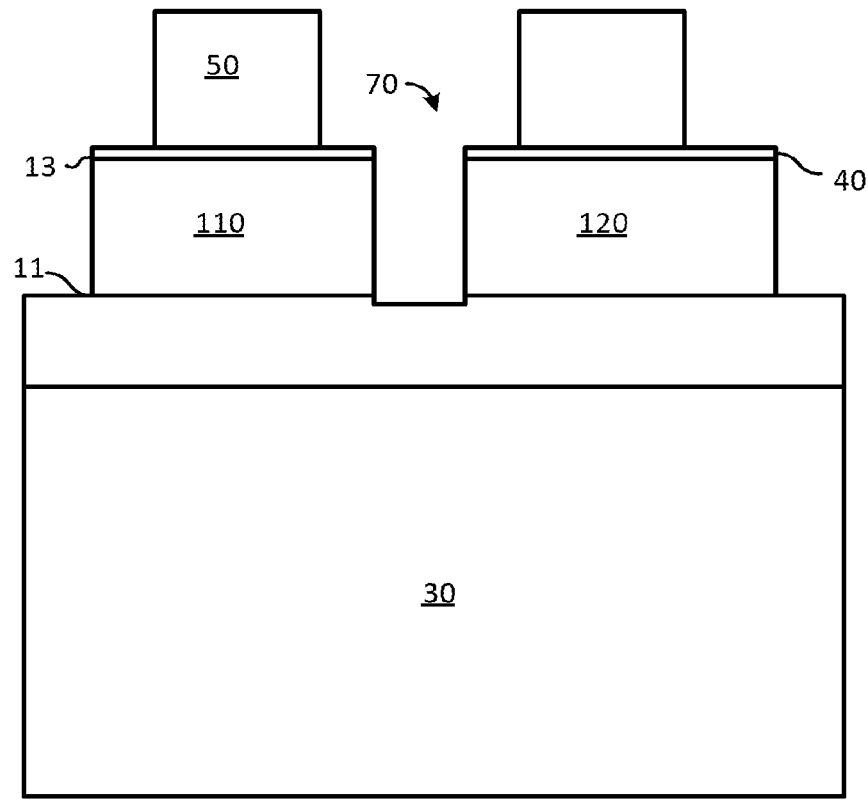
FIG. 6 illustrates a semiconductor device during fabrication after dicing the substrate in accordance with embodiments of the present invention.

FIG. 6 illustrates a semiconductor device during fabrication after dicing the substrate in accordance with embodiments of the present invention.

Referring to FIG. 6, the substrate 10 is singulated from the back side 13 to form openings 70. The dicing may be performed using a sawing process in one or more embodiments. A mechanical sawing blade may be used to perform the singulation. Accordingly, the dicing blade cuts from the back side 13 to the front side 11. A portion of the adhesive compound 20 may be removed during this process. In alternative embodiments, other singulation methods including plasma dicing or laser dicing may be used to form the openings 70.

Typical sawing processes are ill suited to cut through thick metal layers. Advantageously, without the back side metallization layer 50 in the dicing streets 75, the sawing process cuts only through the semiconductor substrate 10. In various embodiments, sawing may be done either with or without prior removal of contact layer 40. As the contact layer 40 is thin, singulation may be performed without removing it. Accordingly, embodiments of the present invention avoid the introduction of defects associated with dicing a thick metal layer.

Figure 7:
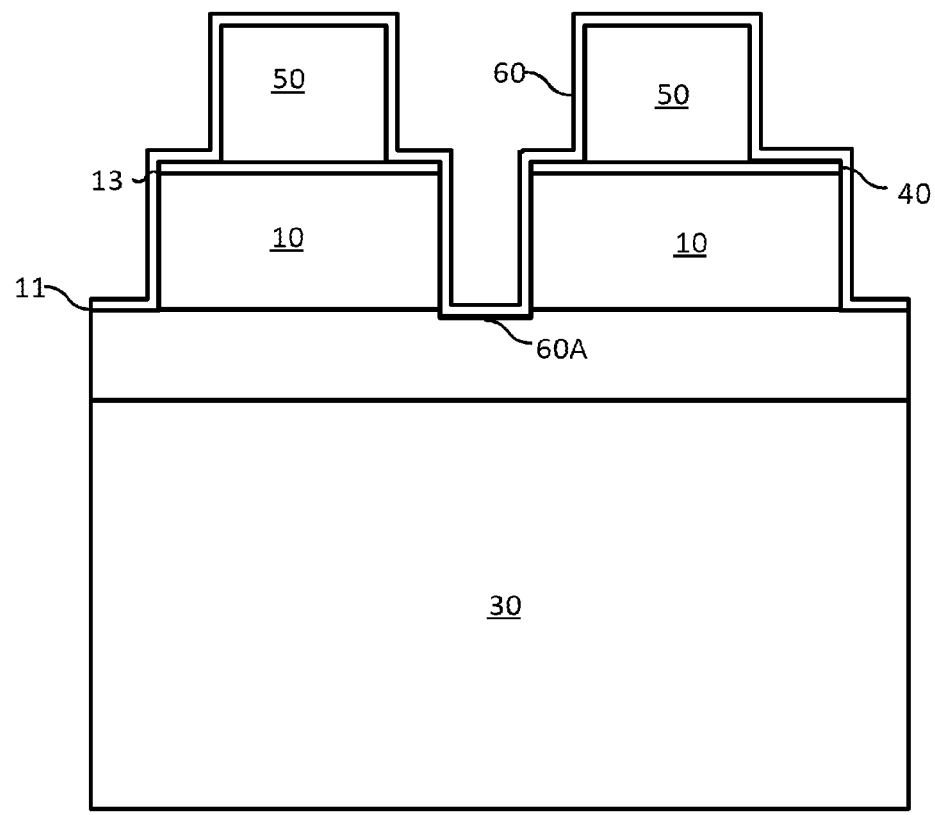
FIG. 7 illustrates a semiconductor device during fabrication after forming a bondable layer in accordance with embodiments of the present invention.

FIG. 7 illustrates a semiconductor device during fabrication after forming a bondable conductive liner in accordance with embodiments of the present invention.

A conductive liner 60 is formed over the patterned back side metallization layer 50 and sidewalls of the substrate 10. The conductive liner 60 may comprise one or more metal stacks in various embodiments. In one embodiment, the conductive liner 60 comprises a copper layer, followed by a tin layer, and a gold layer. In various embodiments, the conductive liner 60 comprises Ni, Au, Sn, Cu, V, Cr, Mo, Pd, W, Ti, TiN, TiW or any combination like Au/Sn, Ni/Au, Ni/Pd, Ni/Pd/Au, Ti/Cu, TiW/Cu, TiN/Cu, Ti/Ni/V, Cr/Cu, or any other combination.

In various embodiments, the conductive liner 60 is configured to be diffusion bonded. For example, the conductive liner 60 may be aligned with a bond pad of another chip, a die pad of a package substrate such as a lead frame, or a PCB and pressed together to form a solid-solid diffusion bond or an isothermal solidification or an eutectic bond. The combination of high temperature and pressure results in the formation of a solid-solid bond or a bond formation via the liquid phase with subsequent solidification. Advantageously, bonding is accomplished without forming a liquid melt.

In some embodiments, the conductive liner 60 may include a solderable layer such as Sn, Zn, In, Ga, Ge, Pb or alloys of these including other alloying elements like AuSn, CuSnAg, SnAg, or any suitable metal, metal alloy or solder material. In some embodiments, the conductive liner 60 may include a protective metal such as silver, gold, platinum, palladium or alloys of these including other alloying elements or any element, alloy or compound, which, e.g., may be appropriate to prevent oxidation of the underlying metal of the conductive liner 60.

As illustrated in FIG. 7, the conductive liner 60 is formed along the sidewalls of the substrate 10 protecting the substrate 10 from any damage subsequently. Further, the conductive liner 60 on adjacent chips is connected through a bridging portion 60A.

In various embodiments, the conductive liner 60 may be formed using a deposition process including sputter deposition, chemical vapor deposition, physical vapor deposition, plasma enhanced vapor deposition, and other vapor deposition techniques, electrochemical deposition process, and others. If an electrochemical deposition process is used, an additional seed layer may be deposited, for example, a chemical vapor deposition process. In one embodiment, the conductive liner 60 may be deposited using an electro-less plating.

Figure 8:
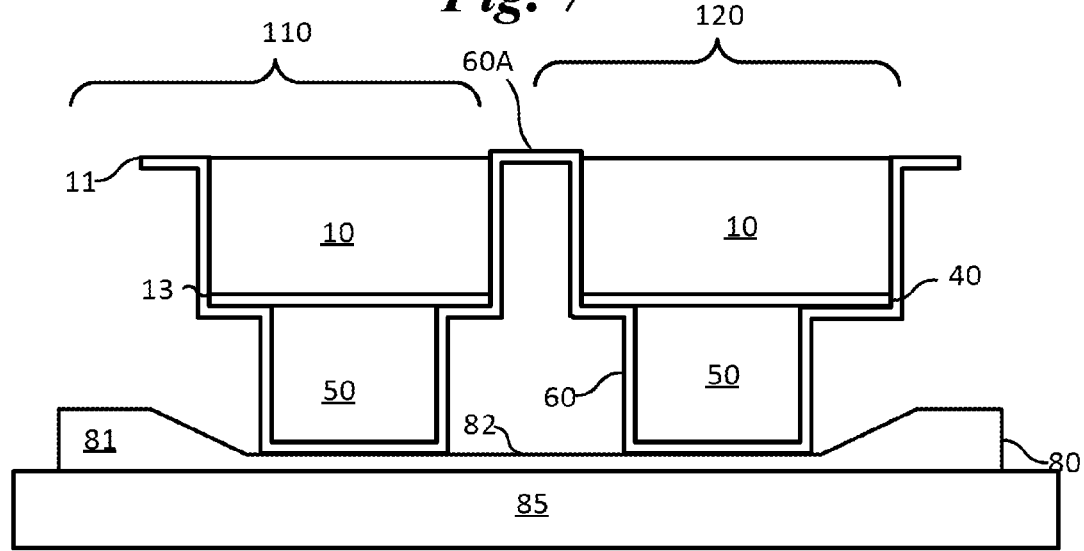
FIG. 8 illustrates a semiconductor device during fabrication after placing the substrate on a tape and removing the substrate from the carrier in accordance with embodiments of the present invention.

FIG. 8 illustrates a semiconductor device during fabrication after placing the substrate on a tape and removing the substrate from the carrier in accordance with embodiments of the present invention.

The substrate 10 is mounted on a tape 80. In one embodiment, the tape 80 may comprise a frame with an adhesive in one embodiment. Alternatively, in other embodiments, the tape 80 may comprise other suitable material to securely hold the substrate 10 during processing.

In one embodiment, the tape 80 comprises a frame 81, which is an annular structure (ring shaped) with an adhesive foil 82. The adhesive foil 82 is supported along the outer edges by the frame 81 in one or more embodiments.

In another embodiment, the tape 80 may comprise an adhesive tape having a substrate, e.g., polyvinyl chloride, with the coating of an adhesive layer such as an acrylic resin. In one or more embodiments, the frame 81 comprises a supporting material such as a metal or ceramic material. In various embodiments, the inside diameter of the frame 81 is greater than the diameter of the substrate 10. In alternative embodiments, the frame 81 may comprise other suitable shapes. As illustrated, the substrate 10 is firmly secured over the central part of the tape 80 in one or more embodiments using the adhesive foil 82.

In various embodiments, the substrate 10 is singulated and the dicing completed using a tape expansion process, which cracks the bridging portion 60A of the conductive liner 60.

In another embodiment, the bridging portion 60A may be removed, for example, using a separate dicing process. Alternatively, in another embodiment, the bridging portion 60A may be removed when the adhesive compound 20 is removed.

In one or more embodiments, the tape 80 may be placed over the expander 85, which may be a heater in one embodiment. The expander 85 expands the tape 80 laterally as shown by the arrows. This generates a stress within the substrate 10, which shears the conductive liner 60 at the bridging portion 60A. In alternative embodiments, the expander 85 may use other techniques to generate stress within the tape 80.

Figure 9:
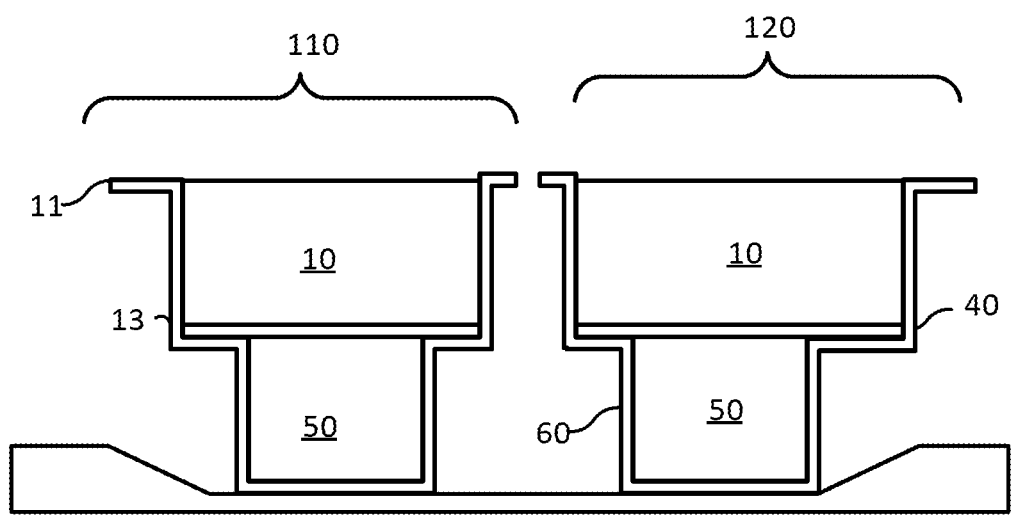
FIG. 9 illustrates the semiconductor device during fabrication after tape expansion that forms separate chips in accordance with embodiments of the present invention.

FIG. 9 illustrates the semiconductor device during fabrication after tape expansion that forms separate chips in accordance with embodiments of the present invention.

Figure 10:
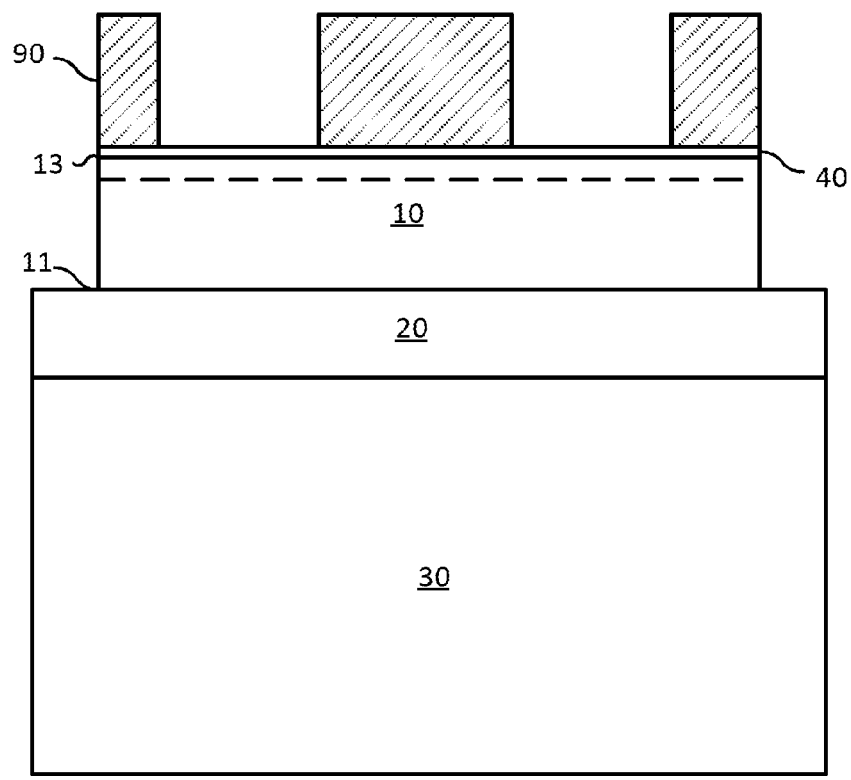
FIG. 10 illustrates a patterned photo resist layer formed over the contact layer disposed over the substrate in accordance with an embodiment of the present invention.
Figure 11:
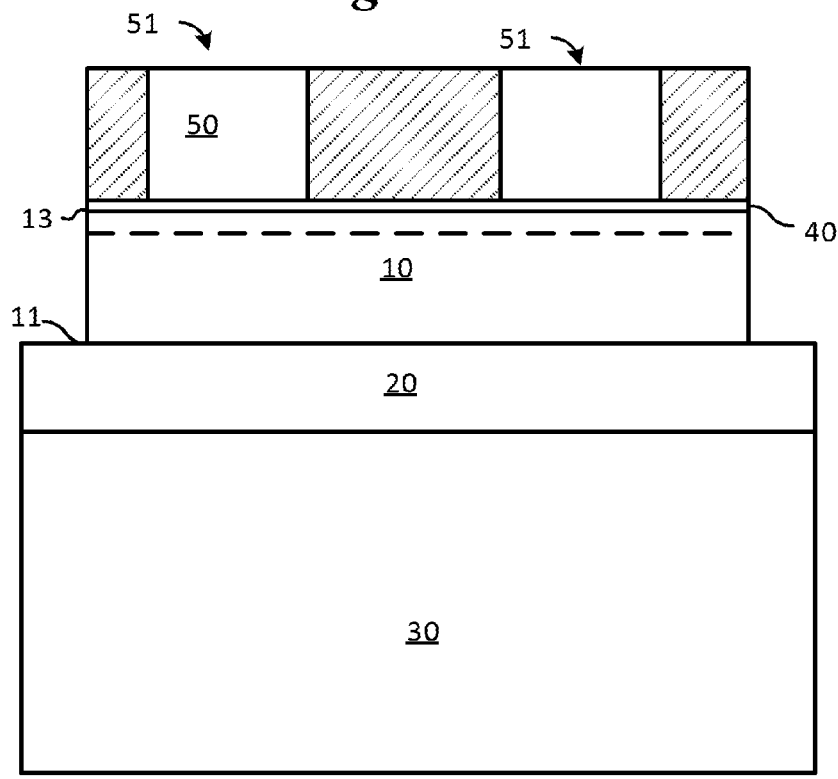
FIG. 11 illustrates a semiconductor device after forming a back side metallization layer within a photo resist layer in accordance with an embodiment of the present invention.
Figure 12:
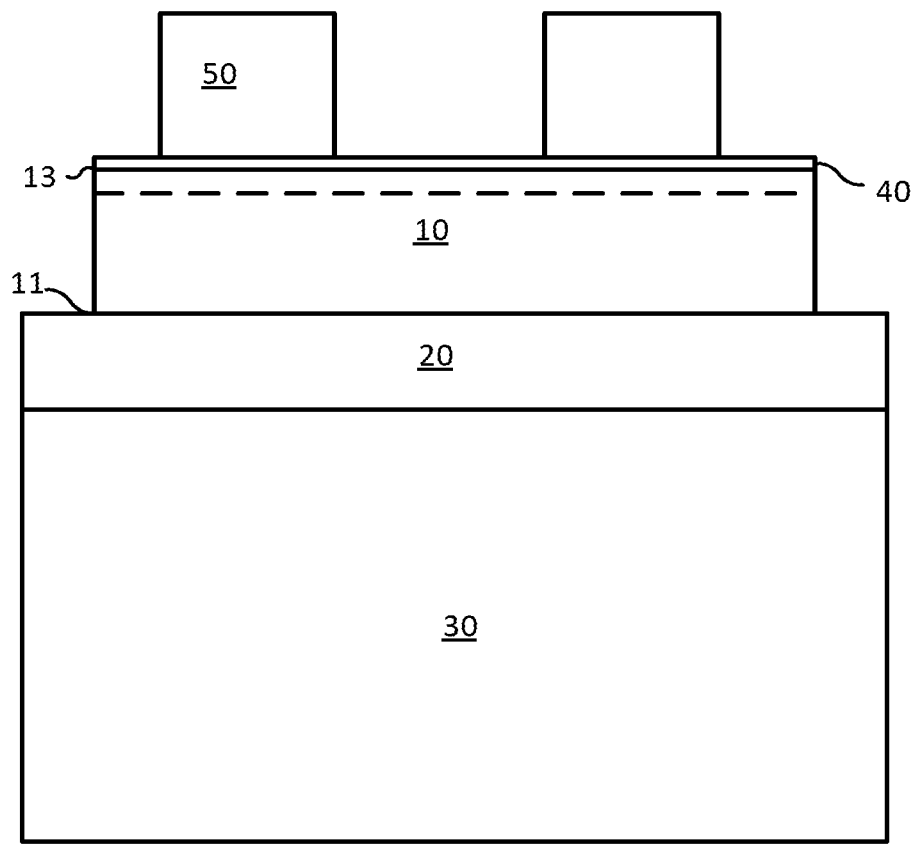
FIG. 12 illustrates the semiconductor device after removing the photoresist layer in accordance with an embodiment of the present invention.

FIGS. 10-12 illustrates a semiconductor device during fabrication in accordance with an alternate embodiment of the present invention.

FIG. 10 illustrates a patterned photo resist layer formed over the contact layer, which is disposed over the substrate in accordance with an embodiment of the present invention.

In this embodiment, the patterned back side metallization layer is formed using a damascene process in a pattern plating process. This embodiment follows the prior embodiment as described in FIGS. 1-3. Subsequently, after forming the contact layer 40, a photo resist layer 90 is deposited. Using conventional lithography techniques, the photo resist layer 90 may be exposed, and developed to form a patterned photoresist as illustrated in FIG. 10.

As illustrated in FIG. 10, a photo resist layer 90 is formed over the contact layer 40. In one embodiment, the photo resist layer 90 is a negative resist although in other embodiments positive resist may also be used. A negative resist may be used to prevent negatively tapered metal lines and/or avoid forming foot (undercut) in the metal line being formed. The photo resist layer 90 is exposed using a lithographic mask and developed so as to form a patterned resist. The patterned resist exposes some regions of the contact layer 40 for forming metal pads by covering the remaining regions of the contact layer 40. The photo resist layer 90 has a thickness of about 5 µm to about 50 µm in various embodiments, and about 5 µm to about 25 µm in one embodiment.

In various embodiments, after the development of the photo resist layer 90, an additional plasma treatment may be performed to improve the profile of the developed photo resist layer 90. For example, the plasma treatment may remove resist foots, which may be formed after development.

FIG. 11 illustrates a semiconductor device after forming a back side metallization layer within a photo resist layer in accordance with an embodiment of the present invention.

As next illustrated in FIG. 11, a metal is deposited within the openings of the patterned photoresist layer 90. In one or more embodiments, the metal is deposited using an electochemical deposition process. Accordingly, the metal selectively grows on the exposed contact layer 40. Thus, a patterned back side metallization layer 50 is formed.

In one or more embodiments, copper pads 51 are formed over the contact layer 40 between the patterned photo resist layer 90. Copper pads 51 may be in the form of pure copper, including copper with trace impurities, and copper alloys. Consequently, the copper pads 51 selectively form only over the contact layer 40 and do not form over the photo resist layer 90, which is not conductive. In other words, copper pads 51 are formed only in regions not covered by the patterned photo resist layer 90. The thickness of the copper pads 51 after the electro-chemical deposition may be about 2 µm to about 15 µm in one or more embodiments, and about 10 µm in one embodiment. The thickness of the copper pads 51 after the electro-chemical deposition is about 10 µm to about 15 µm while the photo resist layer 90 has a thickness of about 15 µm to about 25 µm in one embodiment.

FIG. 12 illustrates the semiconductor device after removing the photoresist layer in accordance with an embodiment of the present invention.

Referring next to FIG. 12, the patterned photoresist layer 90 is removed, for example using a wet chemical etch process. In another embodiment, the patterned photoresist layer 90 is removed using a plasma process. Subsequent processing can follow as described in various embodiments previously, for example, in FIGS. 6-9.

Figure 13:
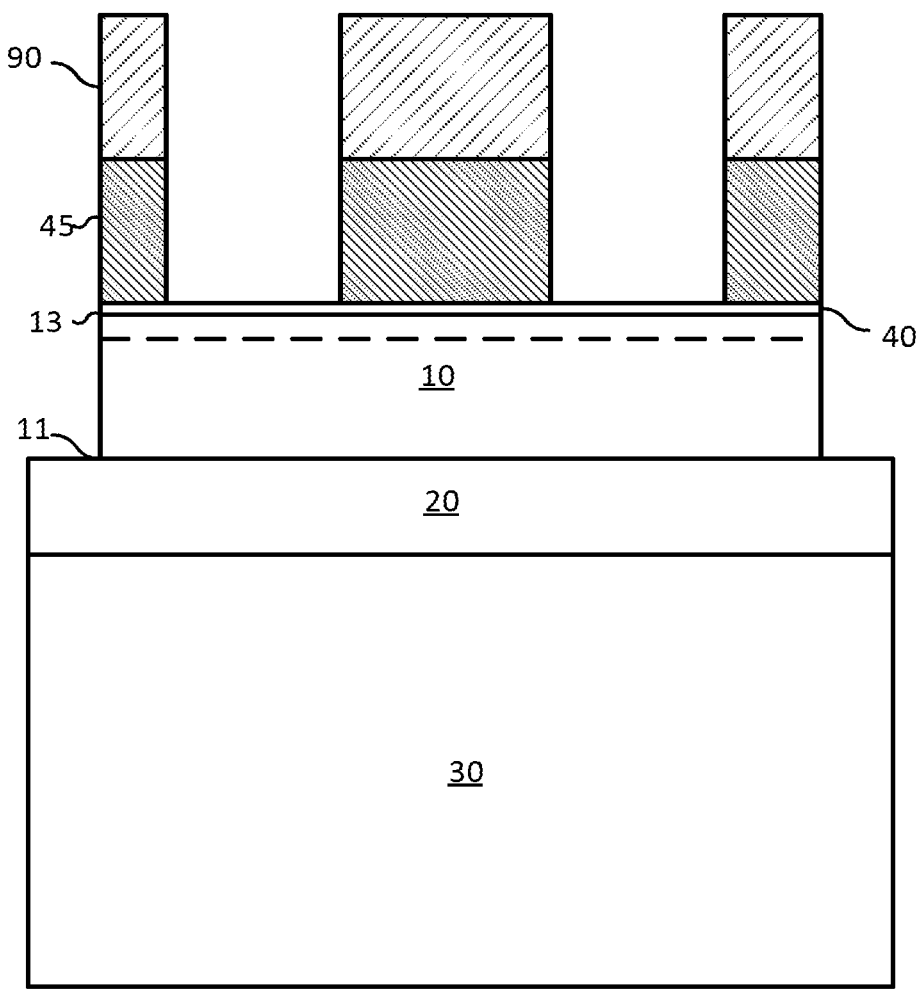
FIG. 13 illustrates a patterned photo resist layer formed over an insulating layer formed over the contact layer in accordance with an embodiment of the present invention.
Figure 14:
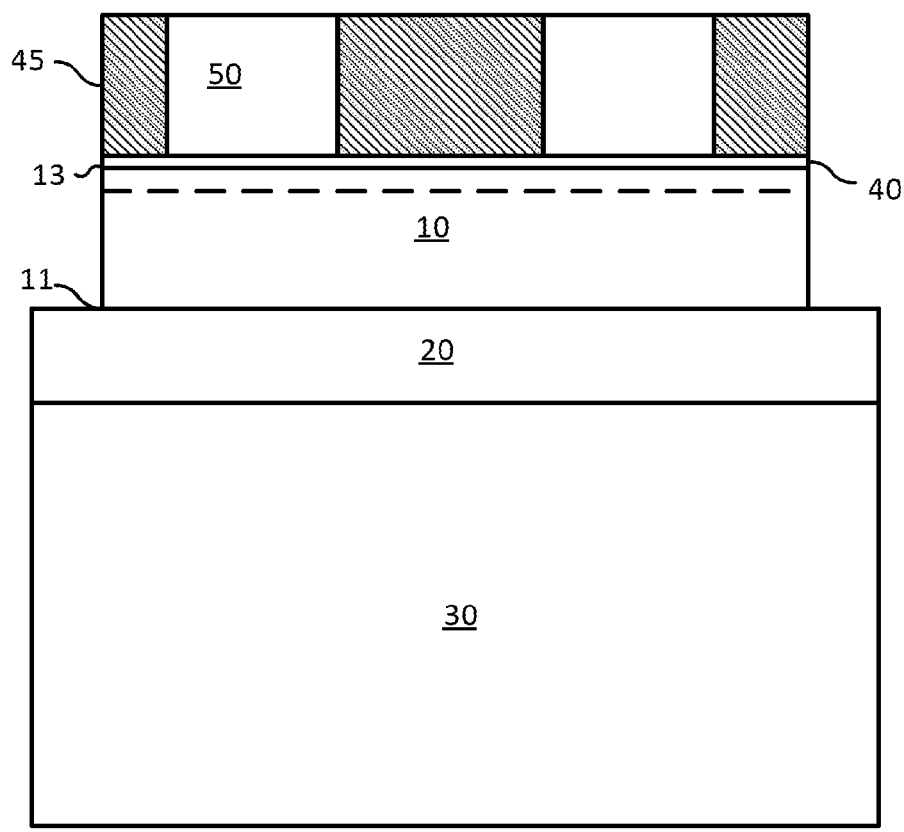
FIG. 14 illustrates a semiconductor device after forming a back side metallization layer within a patterned insulating layer in accordance with an embodiment of the present invention.
Figure 15:
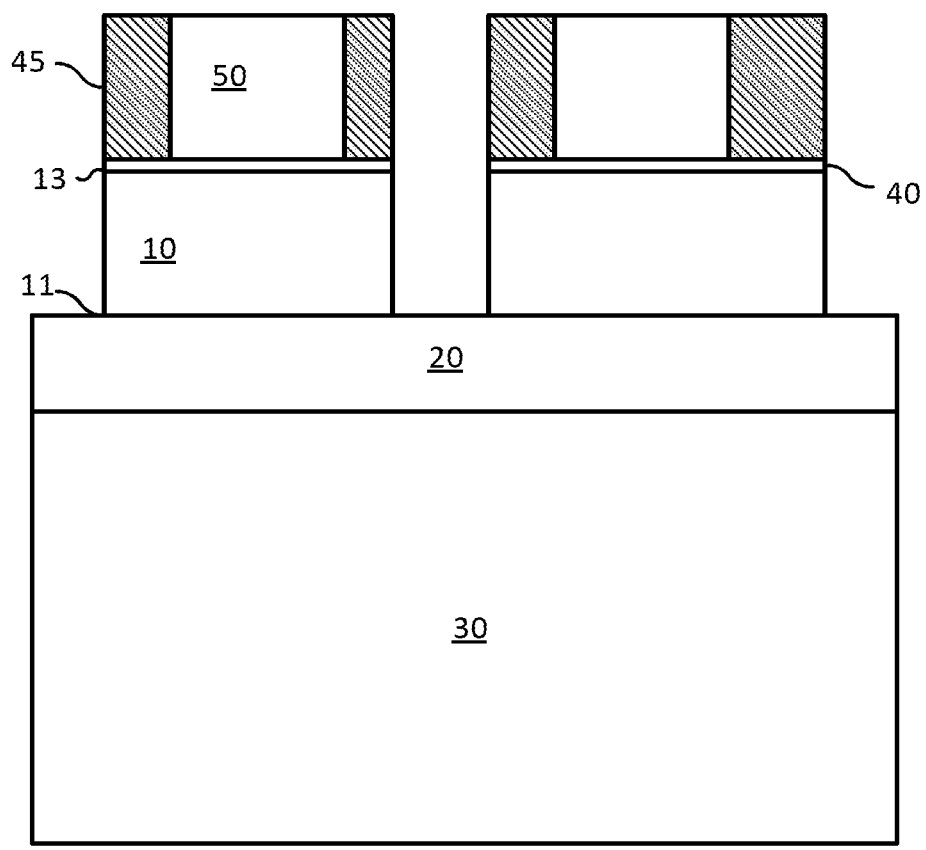
FIG. 15 illustrates a semiconductor device after a dicing process in accordance with an embodiment of the present invention.

FIGS. 13-15 illustrates a semiconductor device during fabrication in accordance with an alternate embodiment of the present invention.

FIG. 13 illustrates a patterned photo resist layer formed over an insulating layer formed over the contact layer in accordance with an embodiment of the present invention.

In an alternative embodiment, a dielectric layer 45 is deposited over the contact layer 40 and patterned as illustrated in FIG. 13. Accordingly, a photo resist layer 90 is deposited and patterned as described earlier. Using the patterned photo resist layer 90 as an etch mask, the dielectric layer 45 is patterned.

FIG. 14 illustrates a semiconductor device after forming a back side metallization layer within a patterned insulating layer in accordance with an embodiment of the present invention.

The back side metallization layer 50 is formed within the patterned dielectric layer 45. In various embodiments, the back side metallization layer 50 may be formed using an electroplating process.

FIG. 15 illustrates a semiconductor device after a dicing process in accordance with an embodiment of the present invention. As described previously, the substrate 10 is diced from the back side 13. Unlike sawing through a thick metal layer such as the back side metallization 50, the sawing process proceeds through the dielectric layer 45 without introducing significant defects. Subsequent processing may proceed as described, for example, using FIGS. 7-9.

Figure 16:
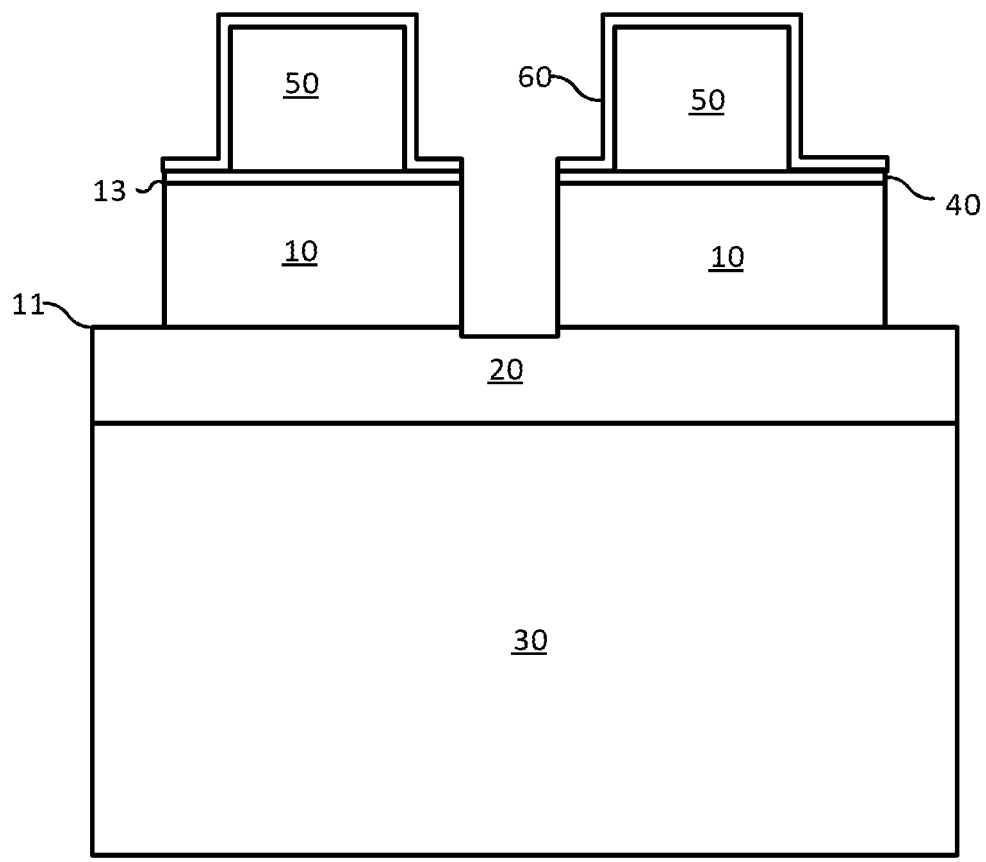
FIG. 16 illustrates an alternative embodiment for forming the conductive liner.

FIG. 16 illustrates an alternative embodiment for forming the conductive liner 60.

Unlike the previous embodiments, in this embodiment the conductive liner 60 is deposited using an anisotropic deposition process. For example, a plating process may be used to form the conductive liner 60. Consequently, the conductive liner 60 is not deposited on the sidewalls of the substrate 10 exposed after the singulation. This embodiment may be used when the metal has to be insulated from the substrate 10. However, in an alternative embodiment, to deposit the metal along the sidewalls as well, a seed layer may be deposited prior to the plating process.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-16 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a semiconductor substrate comprising a first chip region and a second chip region;
   forming a first contact pad over the first chip region and a second contact pad over the second chip region, wherein the first and the second contact pads are at least as thick as the semiconductor substrate;
   dicing through the semiconductor substrate between the first and the second contact pads, wherein the dicing is performed from a side of the semiconductor substrate comprising the first contact pad and the second contact pad; and
   forming a conductive liner over the first and the second contact pads and sidewalls of the semiconductor substrate exposed by the dicing.

2. The method of claim 1, wherein a dicing street of the semiconductor substrate between the first chip region and the second chip region is exposed after forming the first contact pad and the second contact pad.

3. The method of claim 1, further comprising:
   completing singulation by separating the conductive liner at the dicing street.

4. The method of claim 1, wherein the conductive liner is formed after dicing the semiconductor substrate.

5. The method of claim 1, wherein the dicing comprises mechanical sawing, laser dicing, plasma dicing.

6. The method of claim 1, wherein the conductive liner comprises a metal configured to be diffusion bonded.

7. The method of claim 1, wherein the conductive liner comprises copper, tin, silver, nickel, molybdenum, platinum, palladium, gold.

8. The method of claim 1, wherein the conductive liner comprises an alloy comprising tin and gold.

9. The method of claim 1, wherein forming the conductive liner comprises using an electro-less plating process, or sputtering.

10. A method of forming a semiconductor device, the method comprising:
    providing a semiconductor substrate comprising a first chip region and a second chip region;
    forming a contact layer over the semiconductor substrate;
    forming a structured insulating layer over the contact layer;
    forming a contact pad within the structured insulating layer;
    after forming the contact pad, thinning the semiconductor substrate, wherein the contact pad is thicker than the semiconductor substrate after the thinning;
    dicing the semiconductor substrate after thinning the semiconductor substrate; and
    forming a conductive liner over the contact pad and sidewalls of the semiconductor substrate exposed by the dicing.

11. The method of claim 10, further comprising:
    completing singulation by separating the conductive liner.

12. The method of claim 10, wherein the conductive liner is formed after dicing the semiconductor substrate.

13. The method of claim 10, wherein the dicing comprises mechanical sawing, laser dicing, plasma dicing.

14. The method of claim 10, wherein the conductive liner comprises a metal configured to be diffusion bonded.

15. The method of claim 10, wherein the conductive liner comprises copper, tin, silver, nickel, molybdenum, platinum, palladium, gold.

16. The method of claim 10, wherein the conductive liner comprises an alloy comprising tin and gold.

17. The method of claim 10, wherein forming the conductive liner comprises using an electro-less plating process.

18. The method of claim 1, wherein forming the conductive liner comprises using a plating process resulting in anisotropic deposition.

* * * * *